US010721833B1

(12) United States Patent
Meng et al.

(10) Patent No.: US 10,721,833 B1
(45) Date of Patent: Jul. 21, 2020

(54) SERVER

(71) Applicant: HONGFUJIN PRECISION ELECTRONICS (TIANJIN) CO., LTD., Tianjin (CN)

(72) Inventors: Fan-Yin Meng, Tianjin (CN); Han-Yu Li, New Taipei (TW); Ge Liu, TianJin (CN); Cheng Yang, TianJin (CN); Xin Chen, TianJin (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/411,409

(22) Filed: May 14, 2019

(30) Foreign Application Priority Data

Mar. 27, 2019 (CN) .......................... 2019 1 0240053

(51) Int. Cl.
*H05K 7/14* (2006.01)
*H05K 7/20* (2006.01)

(52) U.S. Cl.
CPC ......... *H05K 7/1448* (2013.01); *H05K 7/1449* (2013.01); *H05K 7/1487* (2013.01); *H05K 7/1489* (2013.01); *H05K 7/1492* (2013.01); *H05K 7/20136* (2013.01)

(58) Field of Classification Search
CPC .. H05K 7/1448; H05K 7/1449; H05K 7/1487; H05K 7/1489; H05K 7/1492
See application file for complete search history.

(56) References Cited

U.S. PATENT DOCUMENTS

| 9,462,725 | B2 * | 10/2016 | Jau ........................ H05K 7/1492 |
| 9,854,690 | B1 * | 12/2017 | Frye ...................... H05K 7/1489 |
| 10,588,238 | B2 * | 3/2020 | Kho ...................... H05K 7/1487 |
| 2010/0027213 | A1 * | 2/2010 | Wu .......................... G06F 1/184 361/679.39 |
| 2013/0141863 | A1 * | 6/2013 | Ross .................... G11B 33/128 361/679.33 |
| 2018/0098455 | A1 * | 4/2018 | Ni ............................. G06F 1/20 |
| 2020/0093022 | A1 * | 3/2020 | Ross ...................... G06F 1/187 |

* cited by examiner

*Primary Examiner* — Nidhi Thaker
(74) *Attorney, Agent, or Firm* — ScienBiziP, P.C.

(57) ABSTRACT

A server which can be connected from the back or from the front includes a case and a compute node disposed in the case. The case has a front board and an opposite rear board. The compute node has a plurality of ports for connecting to external cables. The front board has a first opening defined thereon, the rear board has a second opening defined thereon, and the second opening faces the first opening. The compute node is capable of being loaded into the case facing a first direction, such that the plurality of ports are exposed from the first opening. The compute node is also capable of being loaded into the case facing a second direction, opposite to the first direction, such that the plurality of ports are exposed from the second opening.

10 Claims, 7 Drawing Sheets

SERVER

FIELD

The subject matter herein generally relates to a server.

BACKGROUND

One side of a server will have ports to connect to an external cable. The ports of the server may be exposed from a front board or a rear board for connecting cables. Servers with one connection mode can be installed only in one specific type of cabinet. Such a configuration of the server is difficult for maintenance and management and is interchangeable.

Therefore, there is room for improvement within the art.

BRIEF DESCRIPTION OF THE DRAWINGS

Implementations of the present technology will now be described, by way of embodiments, with reference to the attached figures.

DETAILED DESCRIPTION

Figure 1:
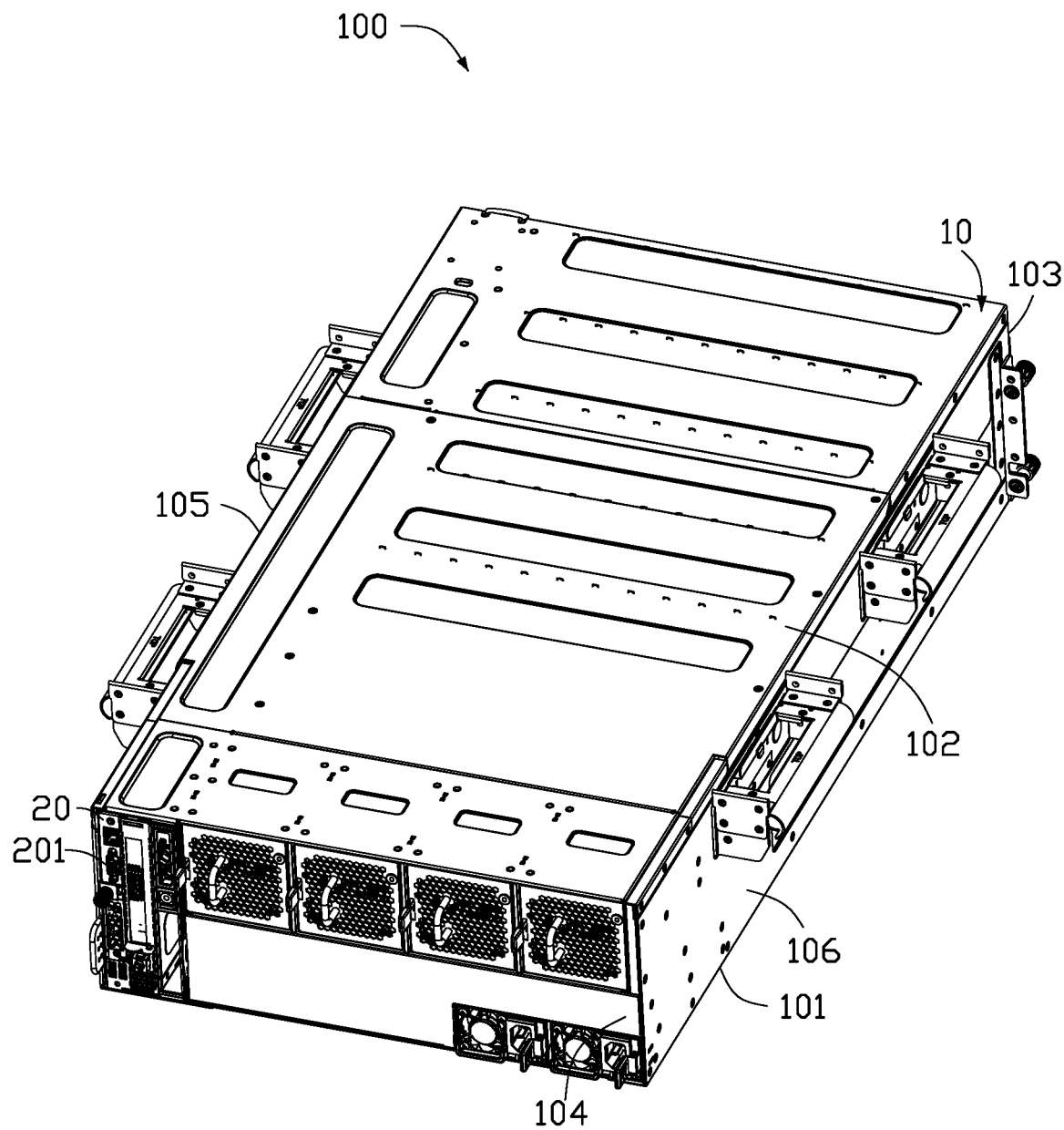
FIG. 1 is an isometric view of an assembled server having a rear board for connecting cables according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Figure 2:
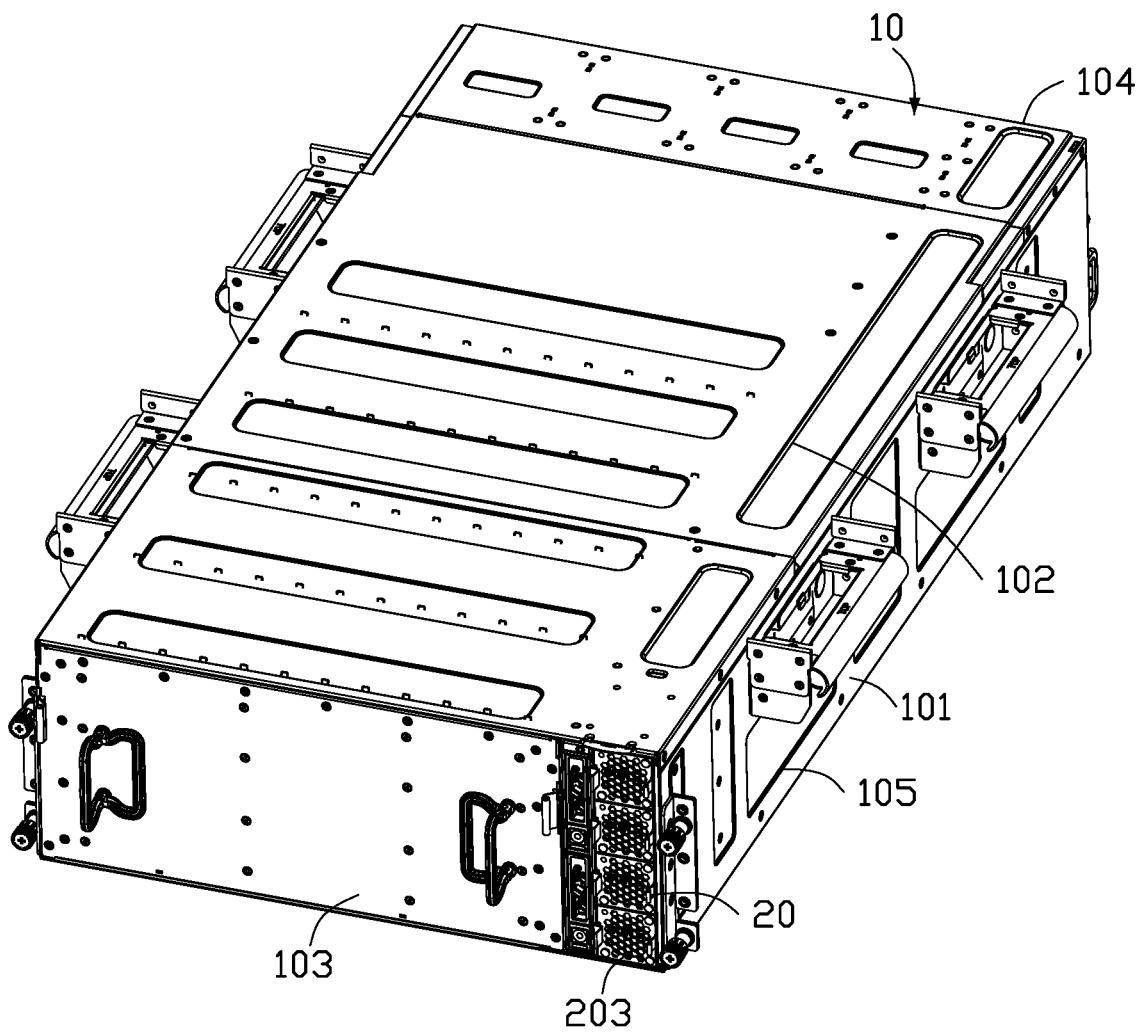
FIG. 2 is an isometric view of the assembled server in FIG. 1 from another angle.

Referring to FIG. 1 and FIG. 2, a server 100 of an embodiment includes a case 10, a compute node 20, a storage node 30, and a power node 40. The compute node 20, the storage node 30, and the power node 40 are disposed in the case 10.

The case 10 is substantially rectangular. The case 10 includes a bottom board 101, a top board 102 opposite to the bottom board 101, a front board 103, a rear board 104 opposite to the front board 103, a first lateral board 105, and a second lateral board 106 opposite to the first lateral board 105. Each of the front board 103, the rear board 104, the first lateral board 105, and the second lateral board 106 connects the bottom board 101 and the top board 102, thereby forming the case 10.

Figure 3:
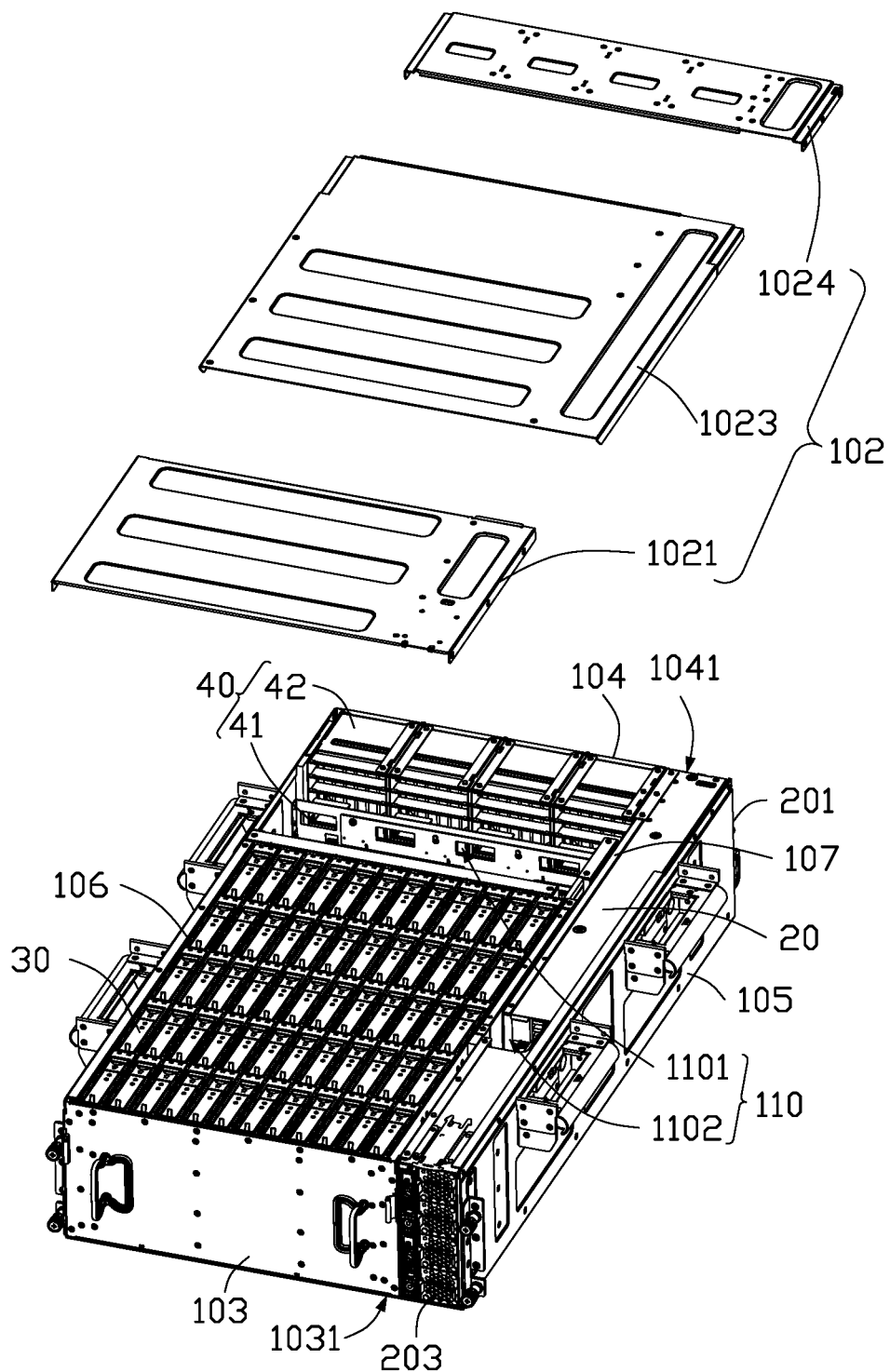
FIG. 3 is an isometric view of the server in FIG. 1 exposed.

Referring to FIG. 3, the bottom board 101, the top board 102, the front board 103, the rear board 104, the first lateral board 105, and the second lateral board 106 together define a receiving chamber 110. The front board 103 has a first opening 1031 defined thereon to communicate with the receiving chamber 110. The rear board 104 has a second opening 1041 defined thereon to communicate with the receiving chamber 110. The first opening 1031 faces the second opening 1041.

In an embodiment, the first opening 1031 and the second opening 1041 may be adjacent to the first lateral board 105, but are not limited thereto. In other embodiments, the first opening 1031 and the second opening 1041 may be disposed on other portions of the front board 103 and the rear board 104.

In an embodiment, the case 10 further includes a division plate 107 therein. The division plate 107 faces the first lateral board 105 and separates the receiving chamber 110 into a first chamber 1101 and a second chamber 1102. The first opening 1031 and the second opening 1041 communicate with the second chamber 1102. The storage node 30 and the power node 40 are installed in the first chamber 1101. The compute node 20 is installed in the second chamber 1102. The compute node 20 electrically connects to the storage node 30 and the power node 40 through cables. In other embodiments, the division plate 107 may be omitted.

In an embodiment, the top board 102 includes a first board 1021, a second board 1023, and a third board 1024. Each of the first board 1021, the second board 1023, and the third board 1024 connects with the first lateral board 105 and the second lateral board 106. Each of the first board 1021, the second board 1023, and the third board 1024 can be demounted and installed individually for easy disassembly and maintenance.

Figure 4:
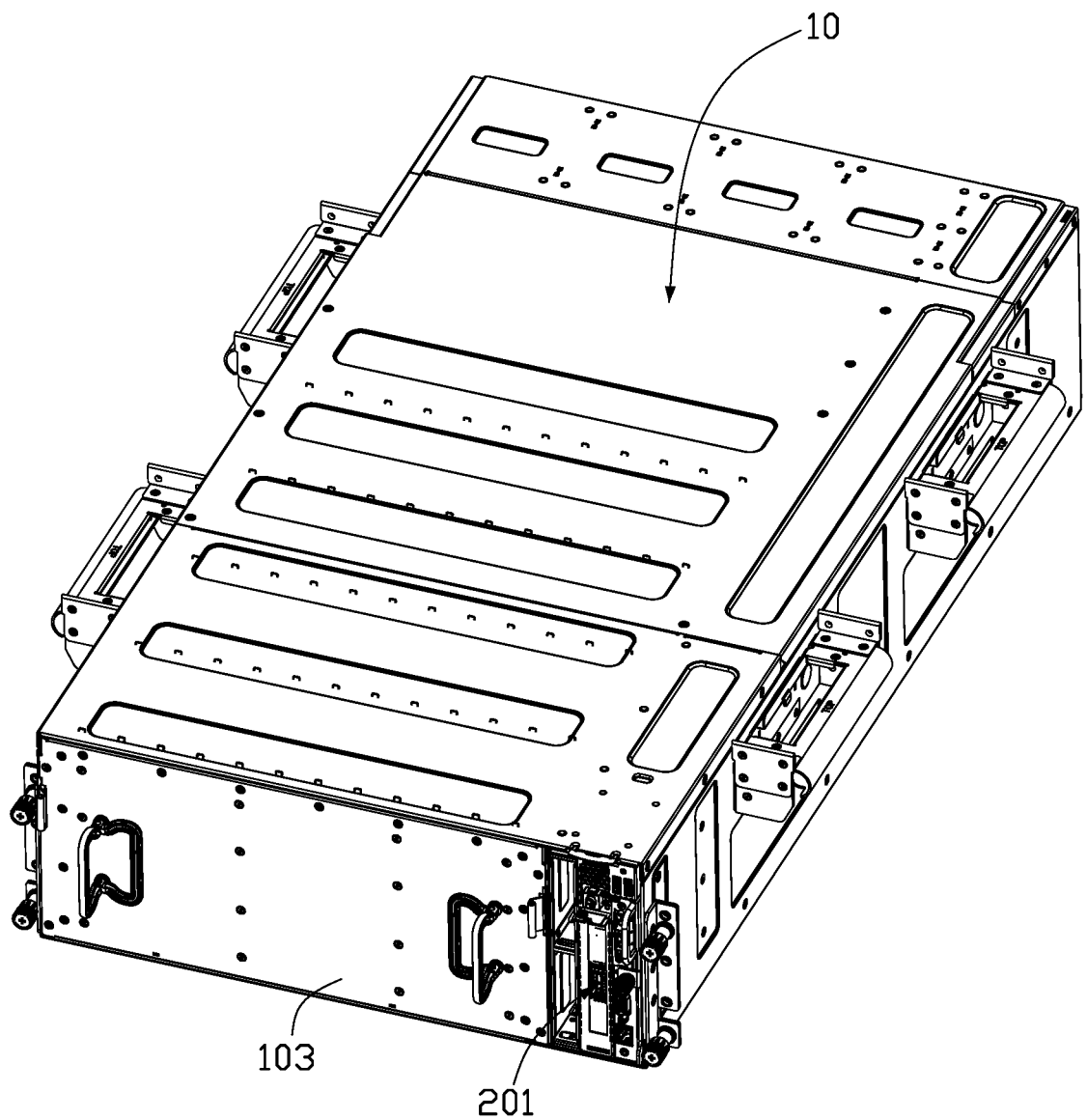
FIG. 4 is an isometric view of the server of FIG. 1 assembled to have a front board for connecting cables.

Referring to FIG. 4, the compute node 20 has a plurality of ports 201 on its side-surface. The compute node 20 may be loaded into the second chamber 1102 facing a first direction such that the plurality of ports 201 are exposed from the first opening 1031. The compute node 20 may be loaded into the second chamber 1102 facing a second direction opposite away for the first direction such that the plurality of ports 201 are exposed from the second opening 1041. When the server 100 is switched to have the front board 103 for connecting cables, the plurality of ports 201 are exposed from the first opening 1031 to connect to external cables. When the server 100 is switched to have the rear board 104 for connecting cables, the plurality of ports 201 are exposed from the second opening 1041 to connect to external cables.

In an embodiment, the compute node 20 further has a plurality of fans 203 thereon for dissipating heat. The plurality of fans 203 are disposed away from the plurality of ports 201. When the front board 103 is used for connecting cables, the plurality of fans 203 are exposed from the second opening 1041. When the rear board 104 is used for connecting cables, the plurality of fans 203 are exposed from the first opening 1031.

Figure 5:
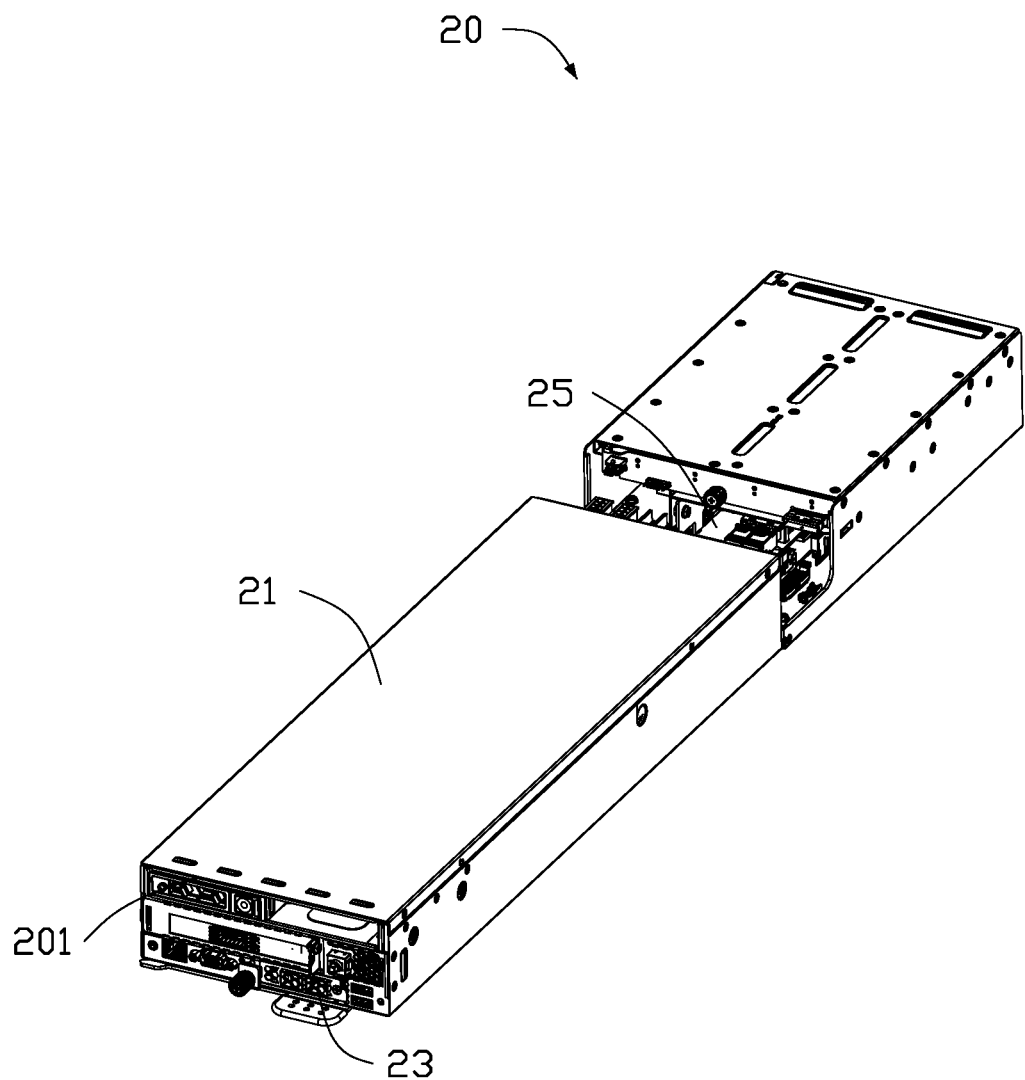
FIG. 5 is an isometric view of an assembled compute node of the server in FIG. 3.
Figure 6:
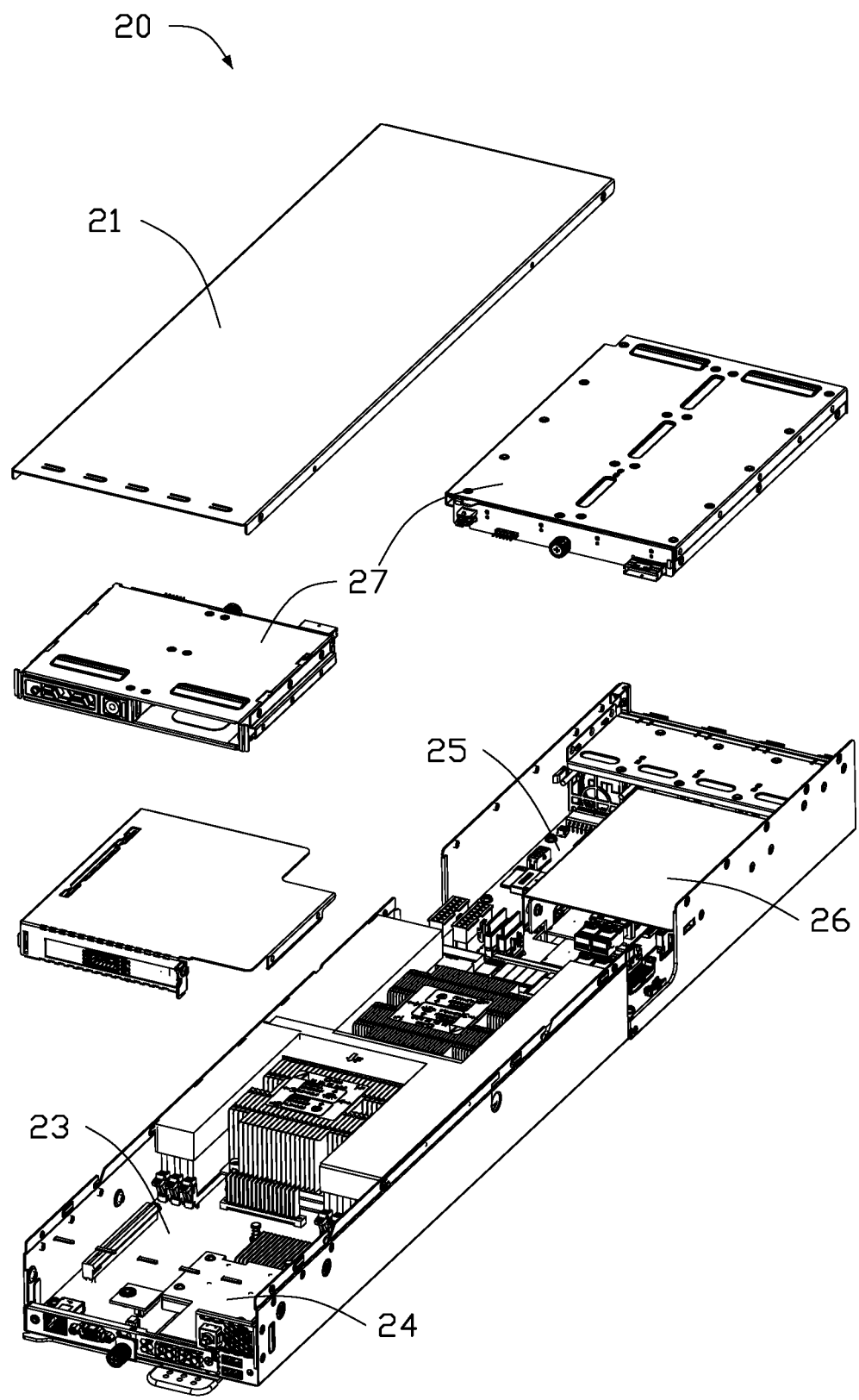
FIG. 6 is an isometric view of the compute node in FIG. 5 exposed.

Referring to FIG. 5 and FIG. 6, the compute node 20 further includes a housing 21, a main plate 23 positioned in the housing 21, a processor (not shown) installed on the main plate 23, a port controller 24, storage device (not shown), heat dissipating devices (not shown), and so on.

The housing 21 is substantially rectangular. Ends of the housing 21 facing the first opening 1031 and the second opening 1041 are open to expose the plurality of ports 201. The housing 21 may be fastened on the case 10 through screws. In other embodiments, the housing 21 may be fastened on the case 10 by friction.

The components, such as the main plate 23 and the port controller 24, have the plurality of ports 201. When the server 100 is switched to have the front board 103 for connecting cables, the plurality of ports 201 face the first opening 1031.

In an embodiment, the compute node 20 further includes a sub-plate 25 positioned in the housing 21 and a host bus adapter (HBA) 26 installed on the sub-plate 25. The sub-plate 25 is electrically connected to the main plate 23. The sub-plate 25 and the main plate 23 are arranged side by side. The plurality of fans 203 are installed on the sub-plate 25 and positioned away from the main plate 23.

In an embodiment, the compute node 20 further includes a hard disk 27 arranged on the sub-plate 25.

Figure 7:
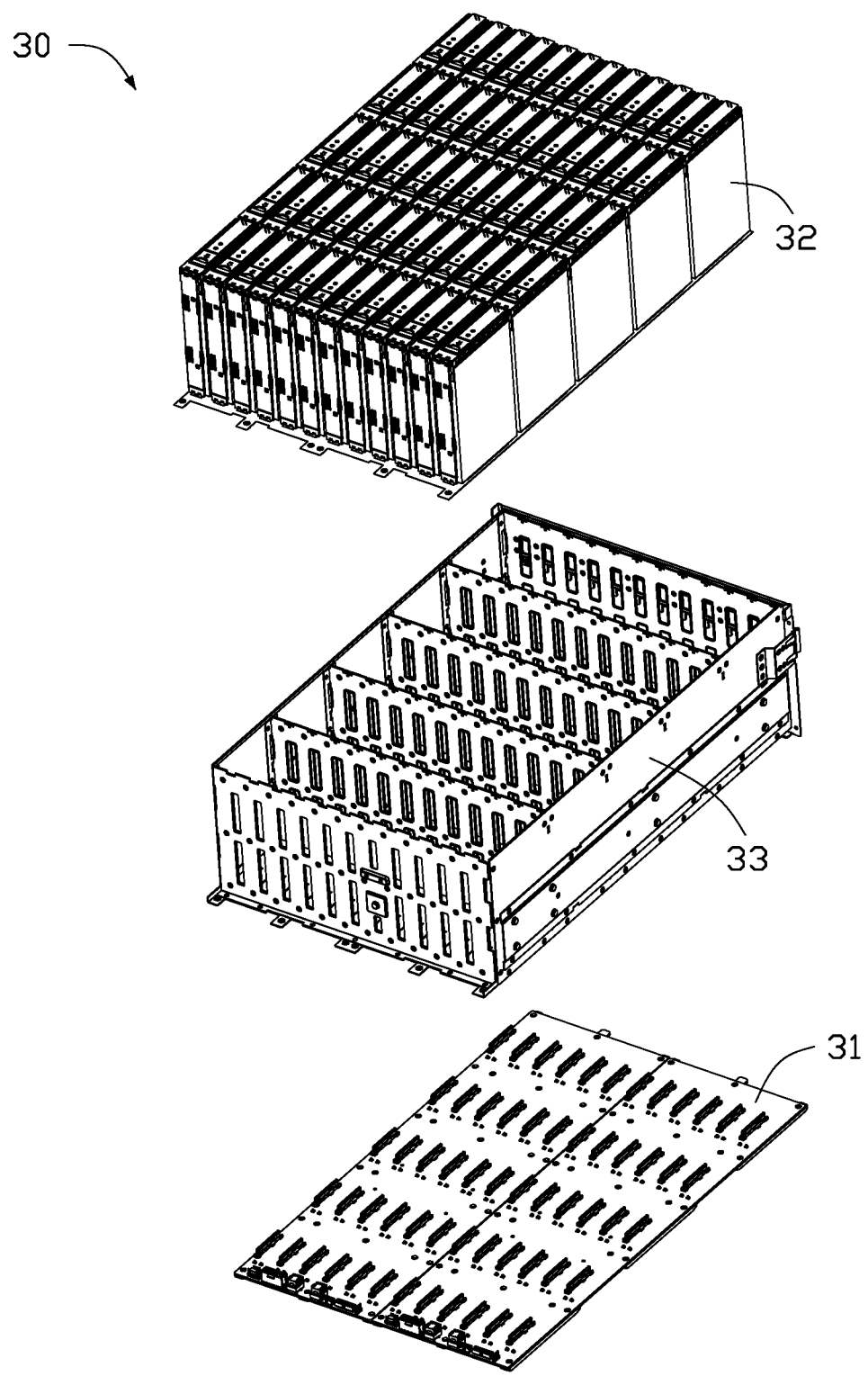
FIG. 7 is an isometric view of an exposed storage node of the server in FIG. 3.

Referring to FIG. 3 and FIG. 7, the storage node 30 includes a bridge plate 31 and a plurality of hard disks 32 arranged on the bridge plate 31. The bridge plate 31 is positioned on the bottom board 101. The bridge plate 31 is electrically connected to the main plate 23 through cables.

In an embodiment, the storage node 30 further includes an installation box 33. The installation box 33 is detachably disposed in the first chamber 1101. The plurality of hard disks 32 are disposed in the installation box 33. The bridge plate 31 is located between the installation box 33 and the bottom board 101. The installation box 33 has a plurality of avoiding holes (not labeled) to provide connection between the plurality of hard disks 32 and the bridge plate 31.

Referring to FIG. 3, the power node 40 includes a power supply module 41 and a fan module 42. The power supply module 41 is disposed in the first chamber 1101 and electrically connects with the compute node 20 and the storage node 30. The fan module 42 penetrates the rear board 104 for dissipation of heat. In an embodiment, the fan module 42 may penetrate the front board 103.

The embodiments shown and described above are only examples. Many such details are found in the relevant art. Therefore, such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A server comprising:
a case comprising a front board and a rear board opposite to the front board;
a compute node disposed in the case;
wherein the compute node has a plurality of ports for connecting to external cables; the front board defines a first opening thereon, the rear board defines a second opening thereon, and the second opening faces the first opening; the compute node is configured to be loaded into the case facing a first direction such that the plurality of ports are exposed from the first opening; the compute node is further configured to be loaded into the case facing a second direction, opposite to the first direction, such that the plurality of ports are exposed from the second opening.

2. The server of claim 1, wherein the compute node further comprises a plurality of fans, the plurality of fans are disposed away from the plurality of ports and exposed from the second opening or the first opening.

3. The server of claim 1, wherein the case further comprises a bottom board, a top board opposite to the bottom board, a first lateral board, and a second lateral board opposite to the first lateral board; each of the front board, the rear board, the first lateral board, and the second lateral board is connected to each of the bottom board and the top board; the bottom board, the top board, the front board, the rear board, the first lateral board, and the second lateral board cooperatively define a receiving chamber configured for receiving the compute node.

4. The server of claim 3, wherein the case further comprises a division plate therein, the division plate faces the first lateral board and separates the receiving chamber into a first chamber and a second chamber; the compute node is disposed in the second chamber, each of the first opening and the second opening communicates with the second chamber.

5. The server of claim 4, further comprising a storage node, wherein the storage node is disposed in the first chamber and electrically connected to the compute node.

6. The server of claim 5, wherein the storage node comprises a bridge plate and a plurality of hard disks arranged on the bridge plate, the bridge plate is disposed on the bottom board, and the bridge plate electrically connects with the compute node through cables.

7. The server of claim 6, wherein the storage node further comprises an installation box, the installation box is detachably disposed in the first chamber, the plurality of hard disks are disposed in the installation box, the bridge plate is located between the installation box and the bottom board, and the installation box defines a plurality of avoiding holes to provide connection between the plurality of hard disks and the bridge plate.

8. The server of claim 3, wherein the top board comprises a first board, a second board, and a third board, each of the first board, the second board, and the third board is connected with each of the first lateral board and the second lateral board, and each of the first board, the second board, and the third board is configured to be disassembled separately.

9. The server of claim 1, wherein the compute node further comprises a housing and a main plate positioned in the housing; the main plate comprises the plurality of ports, and the housing is configured to be opened to exposed the plurality of ports.

10. The server of claim 9, wherein the compute node further comprises a sub-plate and a host bus adapter arranged on the sub-plate, the sub-plate is disposed in the housing and electrically connected with the main plate.

* * * * *